United States Patent
McGrane et al.

(10) Patent No.: US 6,344,787 B1
(45) Date of Patent: Feb. 5, 2002

(54) TRANSFORMER BOBBIN

(75) Inventors: Kevin McGrane, Suffolk; Timothy John Morris, Ipswich, both of (GB)

(73) Assignee: Profec Technologies Limited (GB)

( * ) Notice: Subject to any disclaimer, the term of this patent is extended or adjusted under 35 U.S.C. 154(b) by 0 days.

(21) Appl. No.: 09/701,529
(22) PCT Filed: May 27, 1999
(86) PCT No.: PCT/GB99/01687
§ 371 Date: Nov. 28, 2000
§ 102(e) Date: Nov. 28, 2000
(87) PCT Pub. No.: WO99/63554
PCT Pub. Date: Dec. 9, 1999

(30) Foreign Application Priority Data

May 29, 1998 (GB) .............................................. 9811447

(51) Int. Cl.⁷ .............................................. H01F 27/30
(52) U.S. Cl. ........................ 336/198; 336/192; 336/208
(58) Field of Search ................................ 336/192, 208, 336/198

(56) References Cited

U.S. PATENT DOCUMENTS

| 4,238,753 A | 12/1980 | Bayer | 336/178 |
|---|---|---|---|
| 4,885,559 A | 12/1989 | Nakano | 336/92 |
| 4,949,221 A | 8/1990 | Rollins et al. | 361/400 |
| 5,815,061 A | * 9/1998 | Ho | 336/192 |

FOREIGN PATENT DOCUMENTS

| EP | 0070752 | 1/1983 |
|---|---|---|
| EP | 357237 | 3/1990 |
| EP | 615260 | 3/1994 |
| GB | 2230148 | 10/1990 |
| GB | 2280990 | 2/1995 |
| JP | 61114510 | 6/1986 |

* cited by examiner

Primary Examiner—Anh Mai
(74) Attorney, Agent, or Firm—Bourque & Associates, PA

(57) ABSTRACT

A bobbin for a concentrically wound transformer, preferably a signal transformer, has a core, an area between two shoulders for a primary winding and an area between two flanges for a secondary winding surrounding the primary winding. The shoulder at the end of the transformer where the entry and exit wires for the primary winding are located is formed with an angled axial slot, and with undercut regions beneath the upper surface of the shoulder. The entry and exit wires pass through this undercut region and are thus isolated from the turns of the secondary winding. One lateral edge of the slot and the corresponding lateral edge of the undercut region diverge from one another in the direction of the bobbin end. Also disclosed is a housing for an electronic component, the housing having a set of walls for surrounding the component and lugs past which the component can snap to retain the component in the housing.

11 Claims, 11 Drawing Sheets

TRANSFORMER BOBBIN

This invention relates to a transformer bobbin, in particular for supporting concentric transformer windings. In concentrically wound transformers, a primary winding is wound onto a bobbin, a layer of insulation is applied around the primary winding and then a secondary winding is wound around the primary winding. Such concentrically wound transformers have, in comparison with side by side wound transformers, certain advantages. In particular the leakage inductance can be much lower making the transformer easier to match, and to have a higher frequency response, a wider bandwidth and improved crosstalk characteristics.

Side by side transformers are often encapsulated to achieve the necessary levels of safety, whereas safety isolation is usually provided on concentrically wound transformers by other means. Encapsulation typically impairs the performance of the magnetic core such that concentrically wound transformers may often use less magnetic material than their (encapsulated) side by side equivalents.

In transformer manufacture, in particular in safety isolating signal transformers for use in telecommunications, the isolation of one winding from another is critical and has to be maintained under all conditions. These requirements are often difficult to achieve without adding to the complexity of the manufacturing process, and in particular it can be difficult to provide the necessary isolation for the entry and exit wires to/from the primary winding of a concentrically wound transformer, relative to the secondary winding which will be wound on top.

According to the invention, there is provided a bobbin for supporting concentric transformer windings, the bobbin having an area for receiving a primary winding, shoulders at each end of the primary winding area to define the space for the primary winding, an area for receiving a secondary winding surrounding the primary winding, and flanges at each end of the secondary winding area, wherein one of the shoulders bounding the primary winding area has a slot for the primary winding entry and exit wires, the slot extending across the shoulder from the primary winding area to the adjacent end of the bobbin, the slot communicating with an undercut region of the shoulder, below an upper surface of the shoulder, one lateral edge of the slot and the corresponding lateral edge of the undercut region diverging from one another in the direction of said adjacent bobbin end.

By feeding the primary winding exit and entry wires through an undercut region of the shoulder, the necessary distance through solid insulation between each part of the primary winding and any part of the secondary winding is achieved by the thickness of the shoulder, where it extends across the top of the undercut region. The diverging lateral edges of the slot and of the undercut region ensure that the primary winding exit wire not only can be wound by a conventional winding machine, but also can be reliably placed in a position where it will be separated from any part of the secondary winding by the necessary insulation, be it distance through solid insulation, creepage, clearance or thin sheet insulation.

It is normal for transformer bobbins with laminated cores to have a generally rectangular cross section, and in such a case the end of the slot adjacent to the primary winding area preferably lies on a corner of the bobbin rectangular cross section. Because the windings will always be pulled into closest contact with the bobbin and with the underlying windings at this point, this allows the exit wire to be taken off from the primary winding substantially level with the upper surface of the shoulder. Thus it is ensured that all the primary winding space is used and, for a given size of primary winding, allows the bobbin and thus the transformer to be of small dimensions.

The end of the slot remote from the primary winding preferably lies midway between the position which will be taken up by entry and exit terminals for the primary winding. The lateral edge of the undercut region preferably lies substantially parallel to the bobbin axis, and the lateral edge of the slot lies at substantially 45° to the bobbin axis. The end of the slot adjacent to the primary winding area can be formed with a surface to engage and retain the wire as the wire passes over it, to hold the wire against axial tension. The undercut preferably extends laterally on both sides of the slot and both lateral edges of the undercut region lie parallel to the bobbin axis. The edge of the slot on the exit wire side of the slot is chamfered.

Mountings for both primary and secondary winding terminals can be located radially outside the winding spaces so that there is sufficient creepage distance between the entry and exit wires and the magnetic core, with primary winding terminals being at one end of the bobbin and secondary winding terminals at the other end.

If the primary winding area is located axially centrally relative to the secondary winding area, an advantageous, space-saving arrangement is achieved.

The invention also extends to a concentrically wound transformer formed on a bobbin as set forth above.

According to another important and separate aspect of the invention, there is provided a housing for an electronic component comprising a box-like enclosure open at one side, snap-fit securing means for enabling a component to be fitted into the housing and retained in the housing, and openings through the housing walls at edges and/or corners of the housing. This aspect of the invention extends to the combination of an electronic component and a housing therefore, the housing comprising a box-like enclosure open at one side, snap-fit securing means in the housing, snap-fit features on the component, the snap-fit securing means and the snap-fit features enabling the component to be snap-fitted into the housing and retained in the housing, and openings through the housing walls at edges and/or corners of the housing.

This type of construction has many benefits when compared with the conventional 'potting', 'encapsulation' or 'varnish impregnation' processes. Assembly of the component into the housing now requires only one mechanical action and provides all the required electrical insulation and isolation for the component. Because there is no encapsulating or varnish compound consolidating the component, disassembly and recycling of the materials from which the component is made is easily possible. When the component is a transformer as described here, the plastics housing can be broken to remove the transformer. The laminations can be extracted, as they are only held in position by the housing, and the copper wire can be unwound from the bobbin. The plastics bobbin and housing can be recycled using conventional plastics recycling techniques; the copper wire can be recycled after remelting and the laminations can be reused without any further treatment (or can be recycled after remelting). The material of the laminations is expensive, and this recycling can be worthwhile if only to recover and reuse the laminations. None of this would be feasible with an encapsulated, varnished or over-moulded component which would have to be disposed of in landfill.

Thus, according to a further aspect of the invention, there is provided a housing for an electronic component, the housing having a set of walls for surrounding the component and lugs past which the component can snap to retain the component in the housing.

The housing will preferably have five walls (i.e. an open bottom through which the component can be introduced), and openings at or near the apexes of the housing.

The housing will be particularly suitable for components which are to be mounted on a printed circuit board.

The invention will now be further described, by way of example, with reference to the accompanying drawings in which:

DETAILED DESCRIPTION OF THE INVENTION

Figure 1:
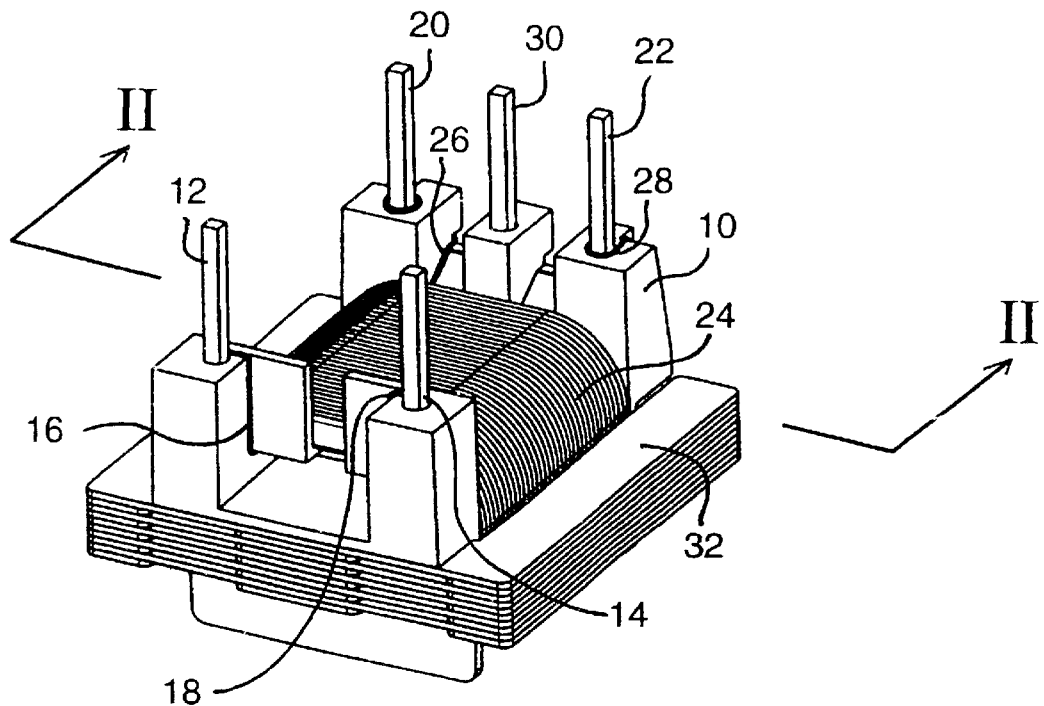
FIG. 1 is a perspective view of a wound transformer, wound on a bobbin in accordance with the invention.

The transformer shown in FIG. 1 has a bobbin 10 moulded from a suitable insulating plastics material. Two terminal pins 12, 14 are provided for the primary winding, and the entry 16 and exit 18 wires can be seen connected to these pins. Two terminal pins 20 and 22 are provided for the secondary winding 24, and again the entry and exit wires for this winding are shown at 26, 28. A third location pin is provided at 30. This may receive a tap from the secondary winding and/or serve to ensure that the transformer is positioned the correct way around when connected to other components. The transformer is completed with a stack of sheet metal laminations, each of which has a central limb 36 which fits through the center of the bobbin 10 and external limbs 77 which fit around the outside of the secondary winding 24. Alternatively (but not shown in the drawings) the core may be a ferrite core.

Figure 2:
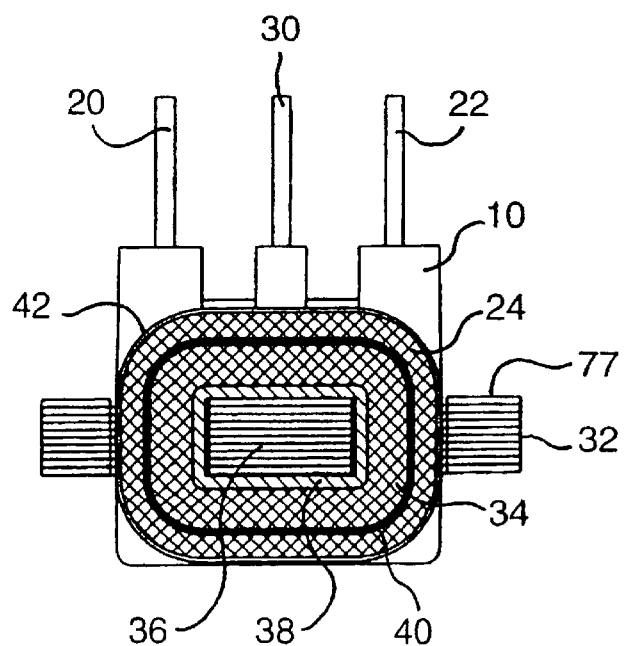
FIG. 2 is cross-section through the transformer of FIG. 1, on the lines II—II.

The cross section shown in FIG. 2 shows, at the center, the limbs 36 of the core laminations, at 38 the (plastics) bobbin central region, at 34 a primary winding wound onto the bobbin central region 38, at 40 a layer of tape insulation (which may consist of several layers of thin tape) which isolates the primary winding 34 from the secondary winding 24, and at 42 an external tape winding covering the secondary winding 24.

Concentrically wound transformers may have all these general features.

Figure 3:
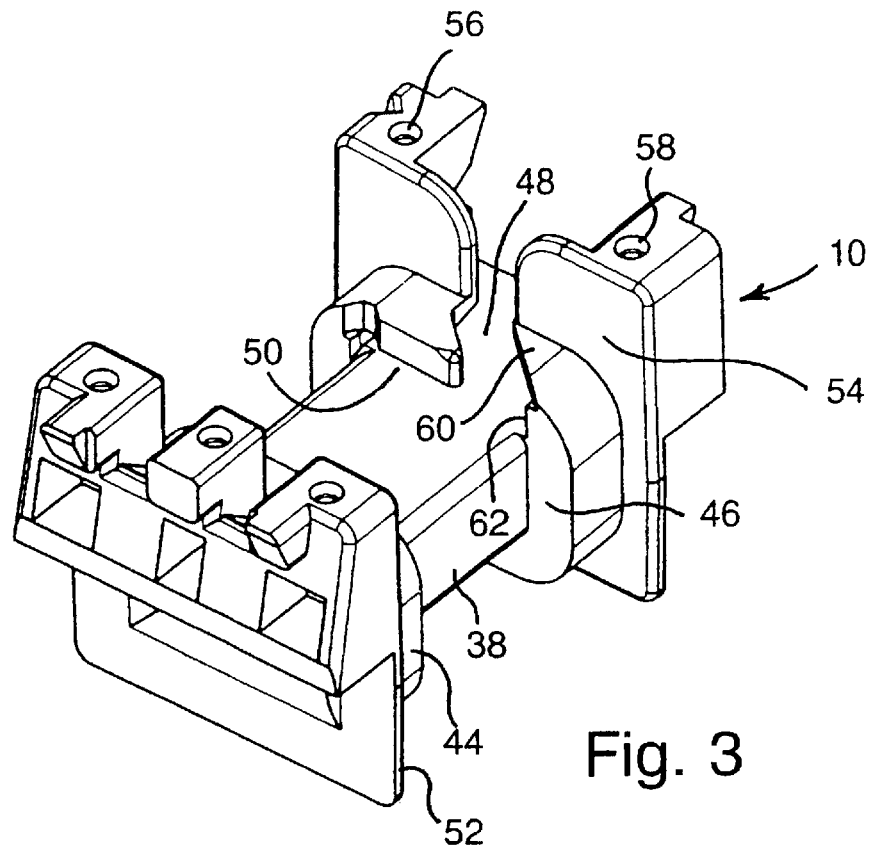
FIGS. 3 and 4 are opposite perspective views of a transformer bobbin in accordance with the invention.
Figure 4:
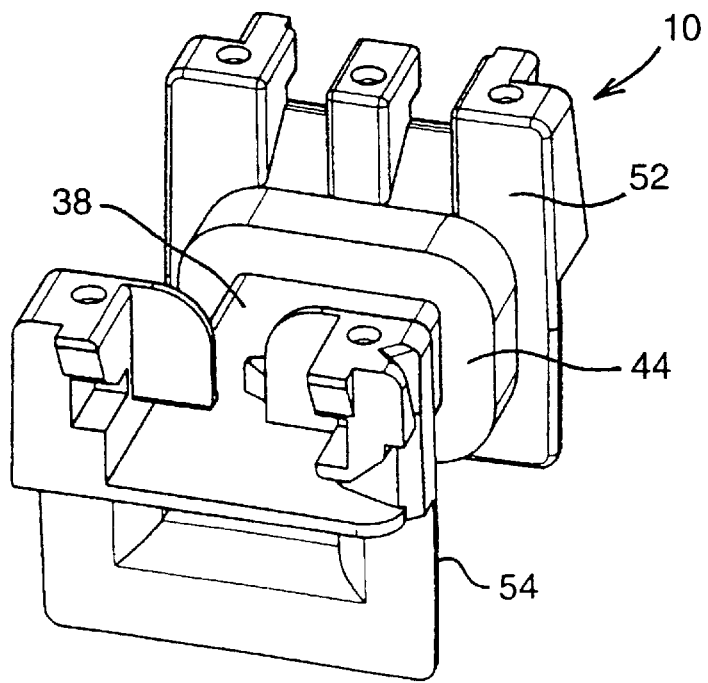

FIGS. 3 and 4 show a bobbin 10 in accordance with the invention without any of the remaining transformer components applied to it. It will be seen that the central region 38 of the bobbin is generally rectangular in cross-section (with rounded corners), and is bounded at each end by a shoulder 44, 46. As can be seen in FIG. 4, the shoulder 44 is continuous and provides a barrier at one end to a primary winding area around the central region 38. The shoulder 46 at the other end is formed with a slot 48, and part of the shoulder 46 is cut away at 50 to provide an undercut region between the primary winding area and bobbin end flanges 52, 54.

Figure 5:
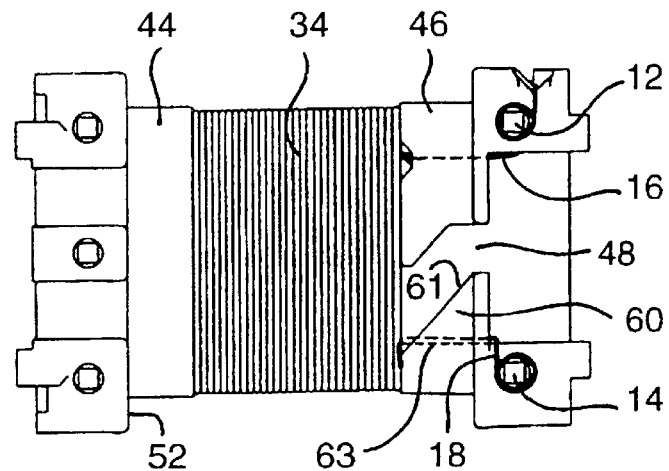
FIG. 5 shows the bobbin of FIGS. 3 and 4 with the primary winding completed.

To apply the primary winding, the primary winding terminal pins 12, 14 are first located and fixed in corresponding holes 56, 58. Using a conventional coil winding machine, the primary winding entry wire is wound around the pin in the hole 56, passes down behind the flange 54, through the undercut 50 and is then wound tightly around the central region 38 of the bobbin, with the turns of wire being wound back and forth to fill the primary winding area until the winding occupies the whole length of the central region 38, and extends up to the full height of the shoulders 44, 46. Once this position has been reached, the exit end of the primary winding is taken out of the primary winding area, through the slot 48, underneath a shelf 60 which bounds the undercut through the shoulder 44 and onto a pin in the aperture 58 where it is wound to make a connection, and then severed. The primary winding is now complete, and the positions of the entry and exit wires can be seen from FIG. 5.

Figure 6:
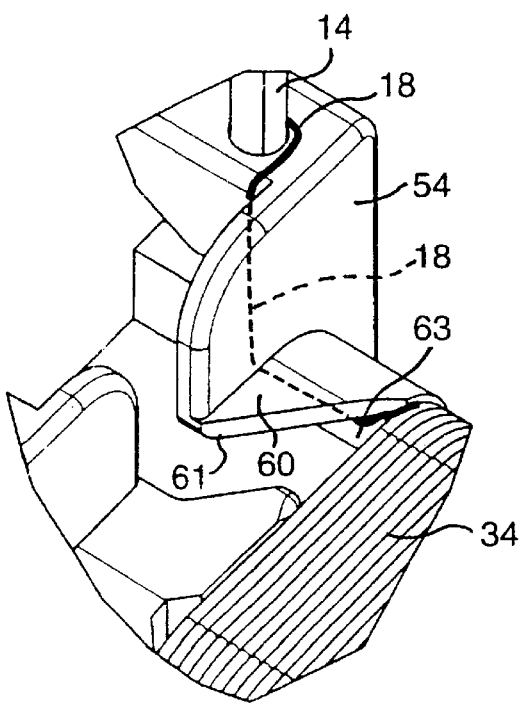
FIG. 6 is a detail on an enlarged scale showing the exit wire of the primary winding.

The position of the exit wire 18 is shown more clearly in FIG. 6. The wire leaves the winding area on the corner of the winding cross section, and is held in this position by a small landing surface. 62 (see FIG. 3). Initially the wire is carried through the slot 4. At this stage, the wire lies parallel to the length of the lateral edge 61 of the slot and thus follows a path at an angle to the coil axis. Once behind the flange 54, the wire is tensioned against the lateral edge 63 of the undercut region and is taken to the pin 14 where it is terminated.

The edge 61 of the slot is chamfered to assist the wire in moving under the shelf 60 when the nozzle from which the wire is fed plunges, moves axially outwards and then moves sideways behind the bobbin.

Figure 7:
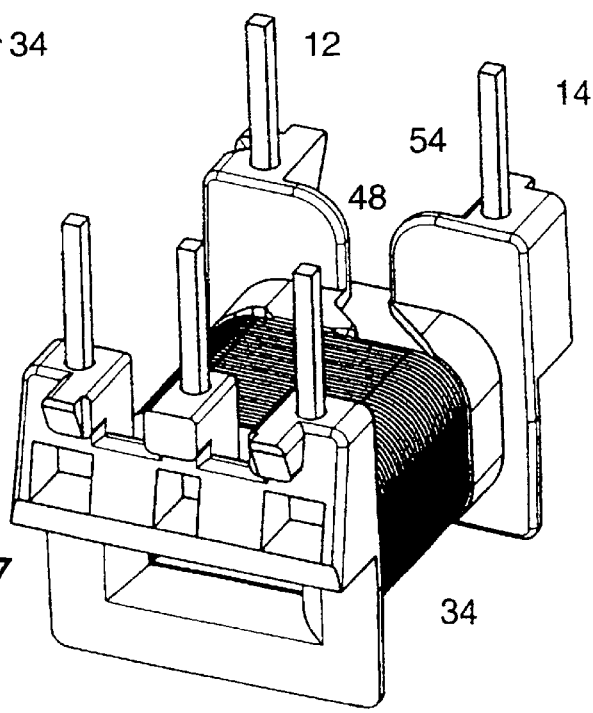
FIG. 7 is a perspective view of the bobbin, ready to accept interlayer tape and a secondary winding.

Once this stage has been completed, the transformer appears as shown in FIG. 7. To complete the transformer, layers of insulating tape will be wound around the shoulders 44, 46 and around the primary winding 34 and then a secondary winding will be applied over the top of the insulating tape, extending right up to the flanges 52,54. The application of the secondary winding follows conventional practice, and will not be described in any further detail, save for noting that the secondary can be wound right out to both flanges 52,54, making for an efficient design.

In designing a transformer, and in achieving the necessary relationship between the primary and secondary windings, the designer has to bear in mind the following parameters:

Cr=creepage

Cl=clearance

D=distance through insulation

M=multiple thin films

Figure 8:
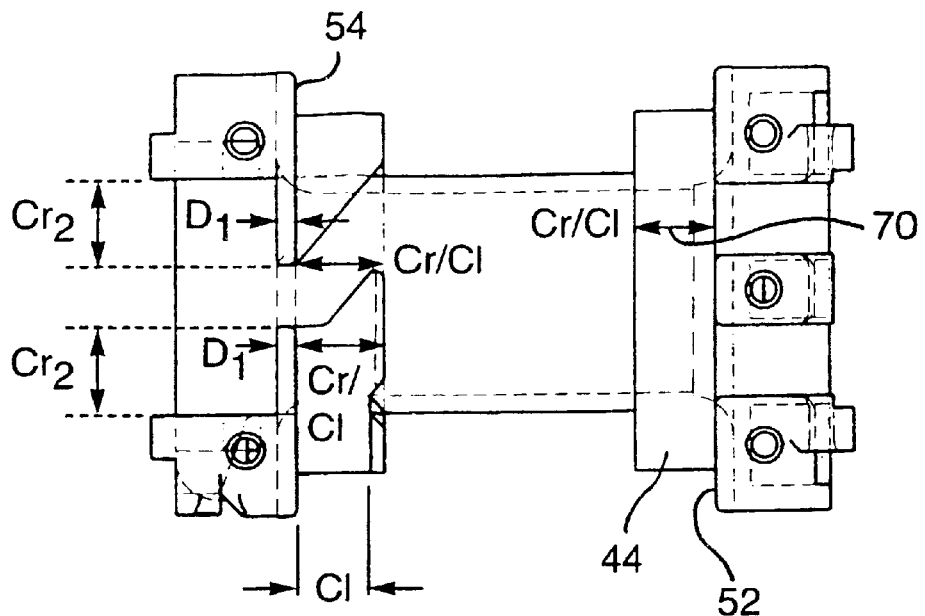
FIG. 8 is a plan view of the bobbin.
Figure 9:
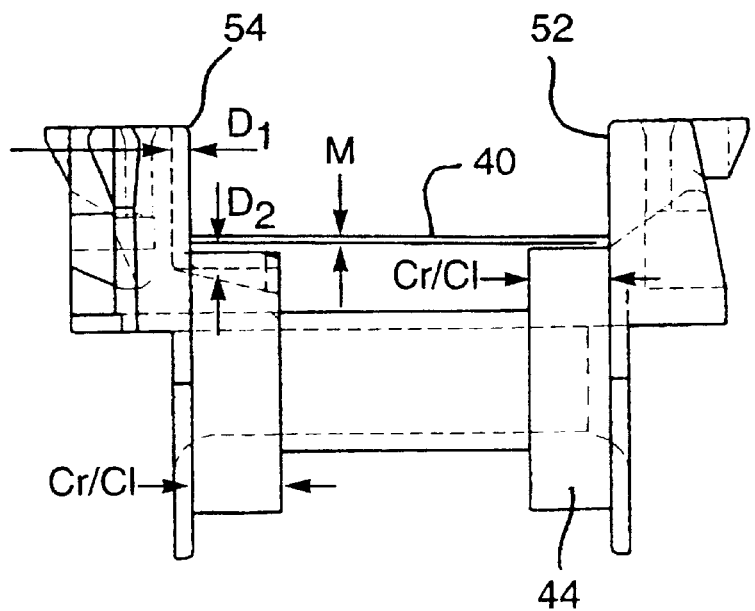
FIG. 9 is a side view of the bobbin, both FIGS. 8 and 9 carrying indications showing the required creepage/clearance dimensions.

These distances are shown on FIGS. 8 and 9 in a manner which demonstrates how the necessary distances are achieved with the aid of the bobbin described.

At the shoulder 44 at the right hand end (referring to FIGS. 8 and 9) the primary winding extends no further towards the flange 52 than the inner end of the shoulder 44 and thus the shortest path between the primary and secondary windings, without travelling through any insulation, will be the distance Cr/Cl indicated by the arrow 70. For this dimension, this is simultaneously the creepage and the clearance path. The entry and exit wires of the secondary winding will be no closer to the primary winding than the turns of the secondary winding, and therefore no special considerations have to be given to those entry and exit wires.

As can be seen in FIG. 9, where the insulating tape 40 is indicated, this provides a multiple thin film insulation (there are several overlapping layers of tape making up the insulation 40) indicated by a dimension M.

However where the primary winding entry and exit wires pass under the secondary winding, to the terminals 12, 14 careful consideration has to be given to the placing of these wires.

Mechanical considerations encourage the exit wire to diverge from the coil at a corner of the rectangular cross section. At the center of each flat face of the cross section, there will be a degree of belling out, and thus it would be difficult to take a wire wound to the full height of the shoulders into a position where it drops below the shelf 60. If the wire diverges at the corner, it can be taken under the shelf 60, even though the height of the winding at the center of the flat face is at or slightly proud of the shoulder.

At the flange end of the shoulder 46 however the considerations are related to electrical isolation, and at this point there needs to be a distance $D_1$ (represented by the thickness of the flange) between the secondary winding 24 and the primary winding entry and exit wires 16,18 where they extend to the terminals 12, 14. The distance $D_1$ is typically 0.4 mm.

There also needs to be a distance through insulation $D_2$ represented by the thickness of the shelf 60, and a shortest creepage path $Cr_2$ between the primary winding entry and exit wires and any possible "dropped" turns of the secondary winding which may drop over the edge of the intermediate tape wrapping 40, against the flange 54.

By designing the shoulder 46 with an angled slot 48, and with an undercut region 50, the primary winding can easily be applied using a conventional winding machine. When the intermediate tape wrapping has been applied and the secondary winding has been wound, all the required safety isolation requirements will be met, and no additional components or windings need to be added to the structure to achieve the necessary isolation.

Because the primary can be wound to completely fill the space allowed for it, no oversizing is necessary, and as a result, the smallest possible overall dimension of component, to meet any given specification, can be achieved. The transformer thus has very good utilization of winding space.

A transformer constructed as described here has no need of encapsulation or varnish impregnation which is sometimes required to meet the isolation requirements. It is desirable to avoid the need for encapsulation and varnishing because these add cost and production time and degrade signal distortion performance.

Because of the efficiency advantages obtained with this construction, some transformers may need less magnetic material in their core than would have been the case with prior art transformers. This can be achieved by using less laminations 32. The laminations which together make up the magnetic core of the transformer have to be lightly pressed together to perform their function. FIGS. 10 to 14 show how this can be achieved, using a moulded housing which also gives other benefits to the completed construction, and which can be used with electronic components other than transformers.

A housing 70 is in the form of a moulded five-sided body. The housing can be moulded with a multi-impression simple open-shut tool without slides.

Figure 10:
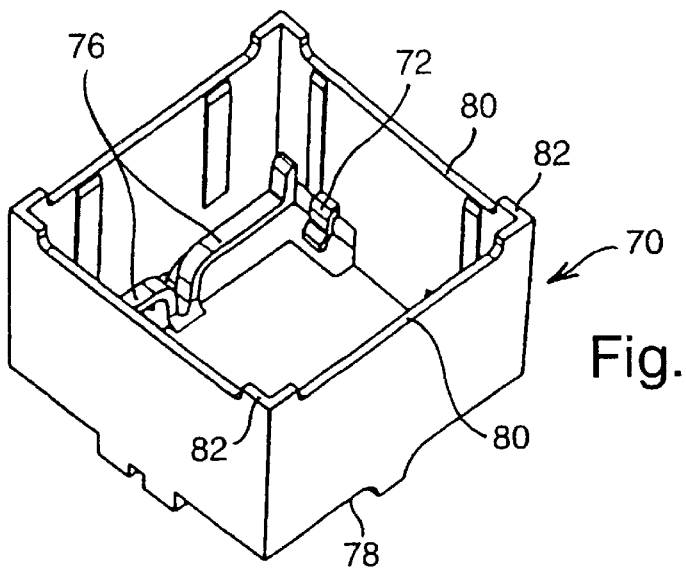
FIG. 10 is an underneath view of a transformer housing in accordance with the invention.

In FIG. 10, we are looking in from underneath. Inside the housing can be seen snap-fit lugs 72 (there will be four of these) into which appropriately positioned feet 74 of the bobbin (FIG. 12) will locate. The bobbin is shown 'naked' in FIG. 12, but will be wound and provided with laminations before being snapped into the lugs 72.

Also inside the housing are four moulded springs 76 (two are visible in FIG. 10). These springs are moulded from the same material as walls of the housing, and act to provide the necessary interlamination pressure, as will be described below.

The housing has open corners 78 (see particularly FIGS. 11 and 14) which allow any liquid penetrating inside the housing to drain away and air to circulate. As the transformer to be housed inside the housing is not encapsulated, it is important that any rinsing fluid be allowed to escape if rinsing of the circuit board has to take place after the components have been mounted. The bottom edges of the housing also have cut-away portions 80 between the corners 82 to allow drainage.

Finally, the top of the housing has a flat area 84 which can receive component identification information and manufacturer's trade marks.

Figure 11:
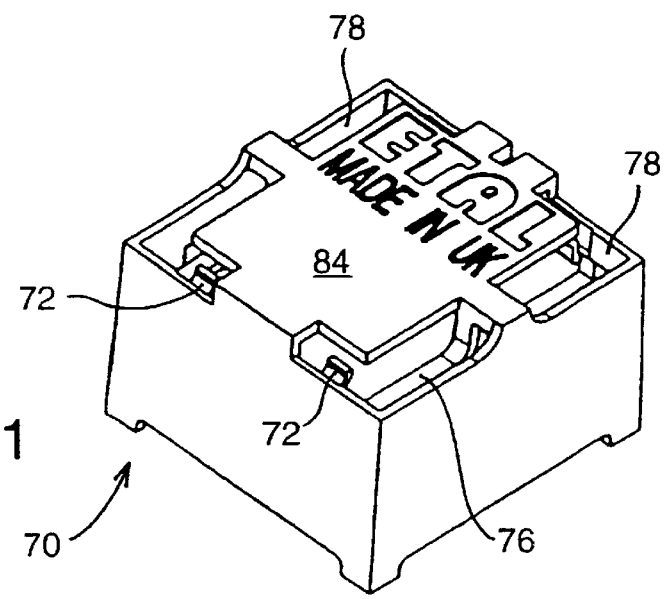
FIG. 11 is a top view of the housing of FIG. 10.
Figure 12:
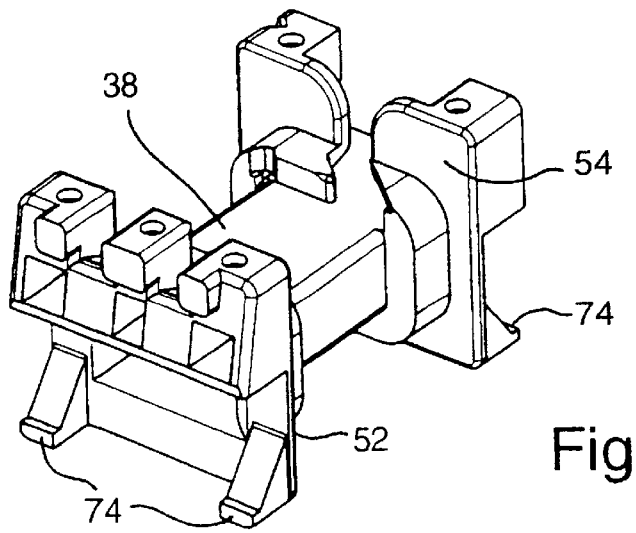
FIG. 12 shows a bobbin in accordance with the invention modified for use with the housing of FIGS. 10 and 11.
Figure 13:
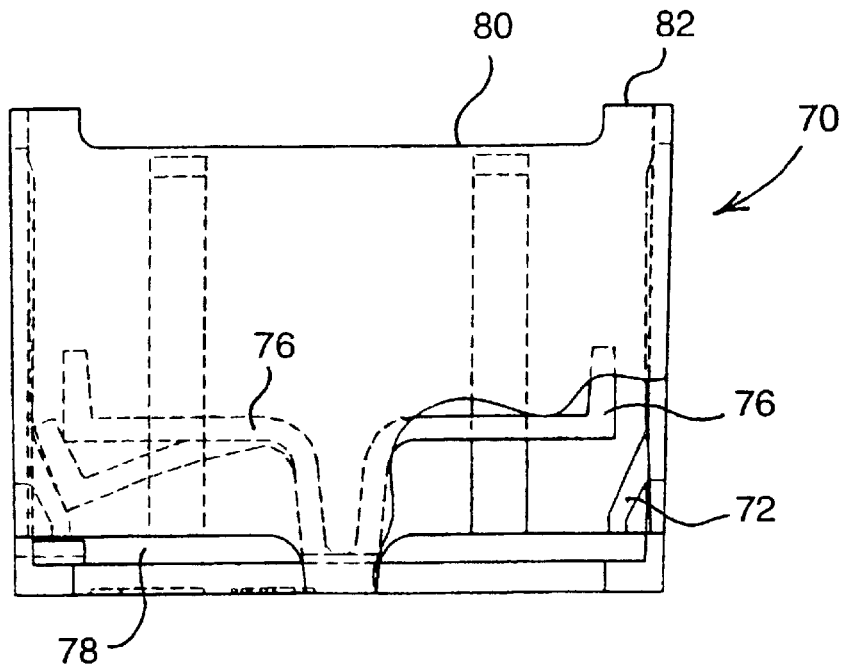
FIG. 13 is a side view illustrating springs which control interlamination pressure.
Figure 14:
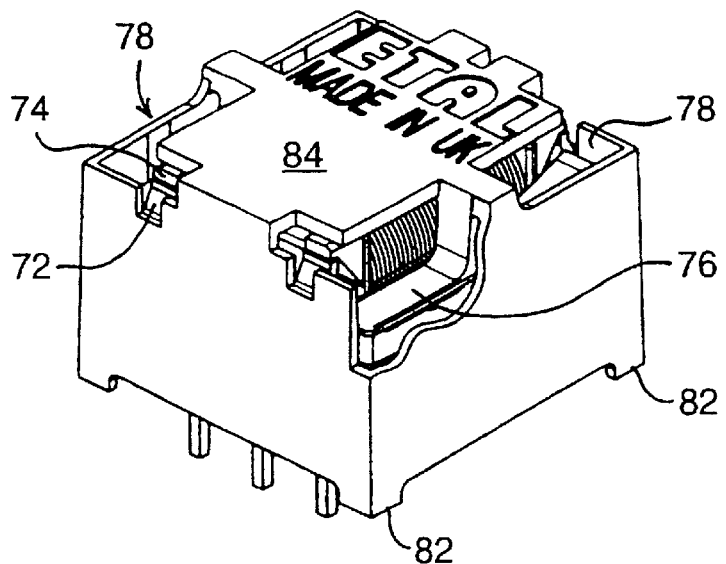
FIG. 14 shows a completed, housed transformer with a part cut away.

FIG. 14 shows the housing walls cut away in the area of the lugs 72. It is preferred to have these lugs located behind a continuous area of wall, as shown in FIGS. 10 and 11, to ensure that the correct creepage/clearance dimensions are maintained by the walls of the housing.

In FIGS. 15 to 19, the basic form of the housing is similar to that shown in FIGS. 10, 11, 13 and 14. The same reference numerals are used for the same features. These figures show various different ways in which the function of the springs 76 can be provided.

Although not shown in the drawings, it will be clear to the skilled man that the lugs 72 can take different forms to those shown in the drawings. The important thing is that there should be a snap-fit engagement between the lugs 72 and the feet 74 of the bobbin, and there are many different arrangements which can be used to achieve this function.

Figure 15A:
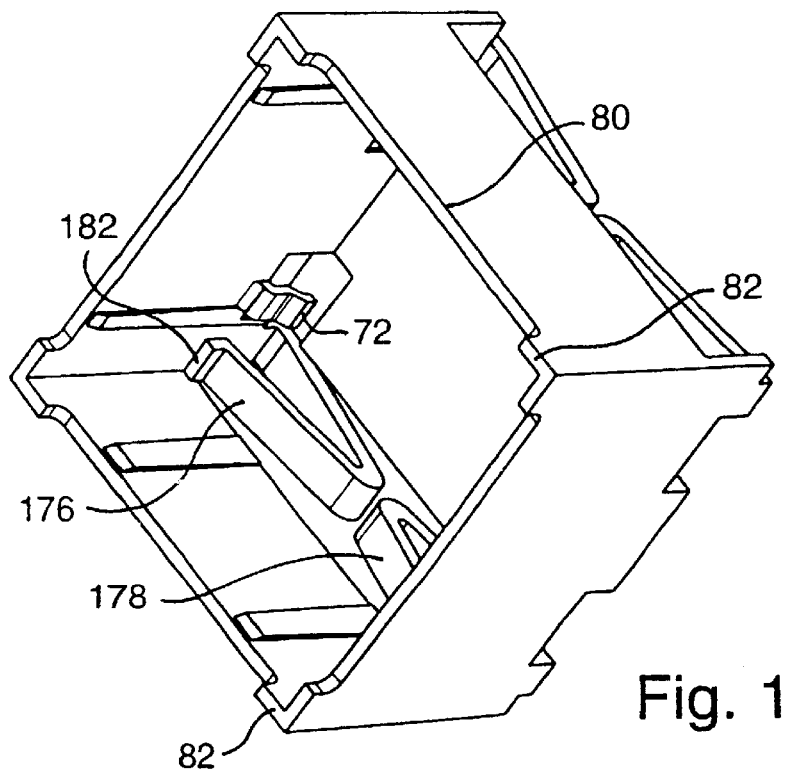
FIGS. 15 to 19 show housings in accordance with the invention with different spring arrangements.
Figure 15B:
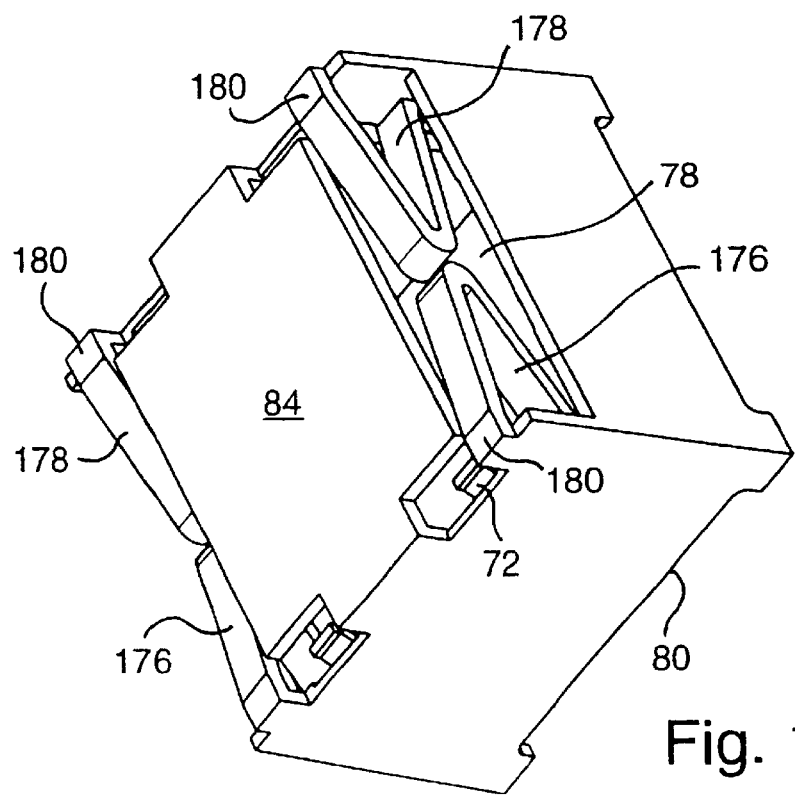

FIGS. 15a and 15b show a housing with, on each side, two independent spring arms 176, 178. These arms are each in a V-shape with one of the ends 180 of each arm moulded integrally with the walls of the housing and the other end 182 being free. The free end 182 will press against the stack of laminations. The top of the housing is cut-away across the top of the springs as can be seen in FIG. 15b.

Figure 16A:
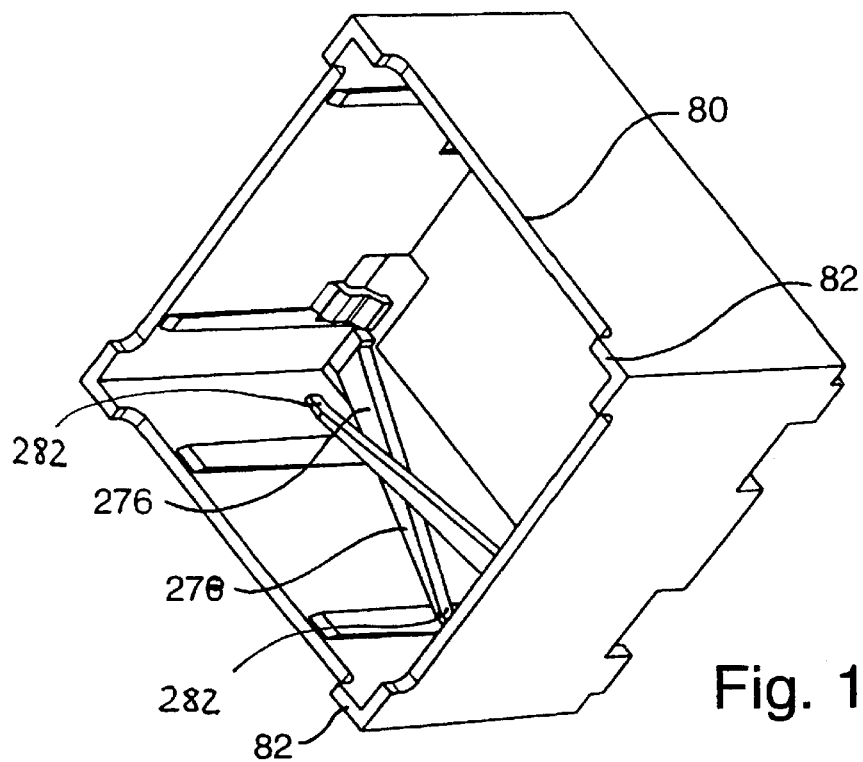
Figure 16B:
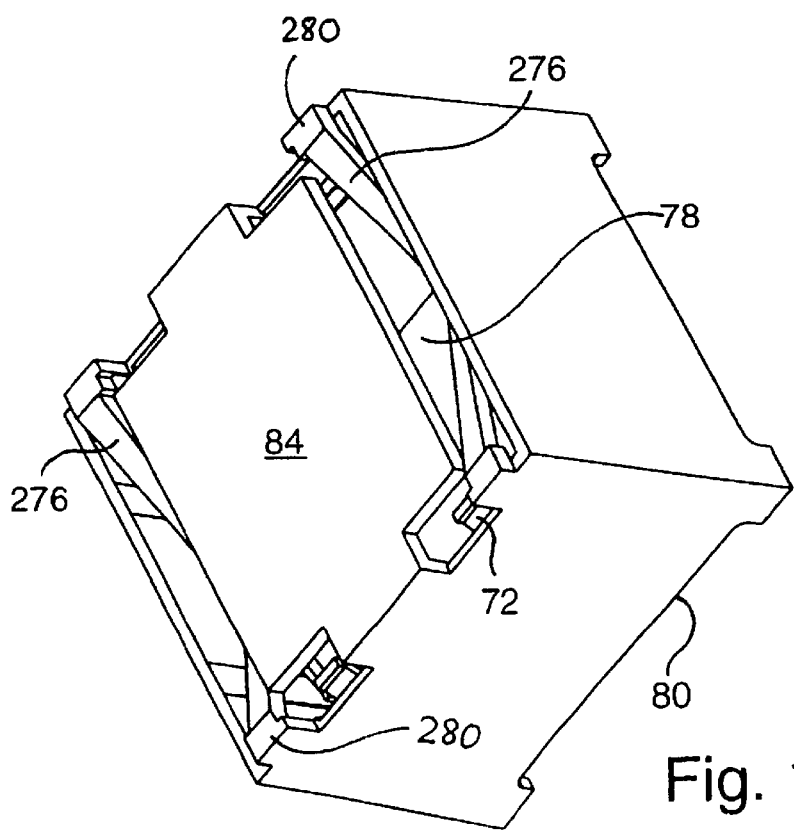

FIGS. 16a and 16b show a housing with, on each side, two independent spring arms 276, 278. These arms cross over, have one end 280 moulded integrally with the walls of the housing and extend towards the opposite side of the housing so that their free ends 282 are on the opposite side of the middle of the housing than their fixed ends. The top of the housing is cut-away across the top of the springs as can be seen in FIG. 16b.

Figure 17A:
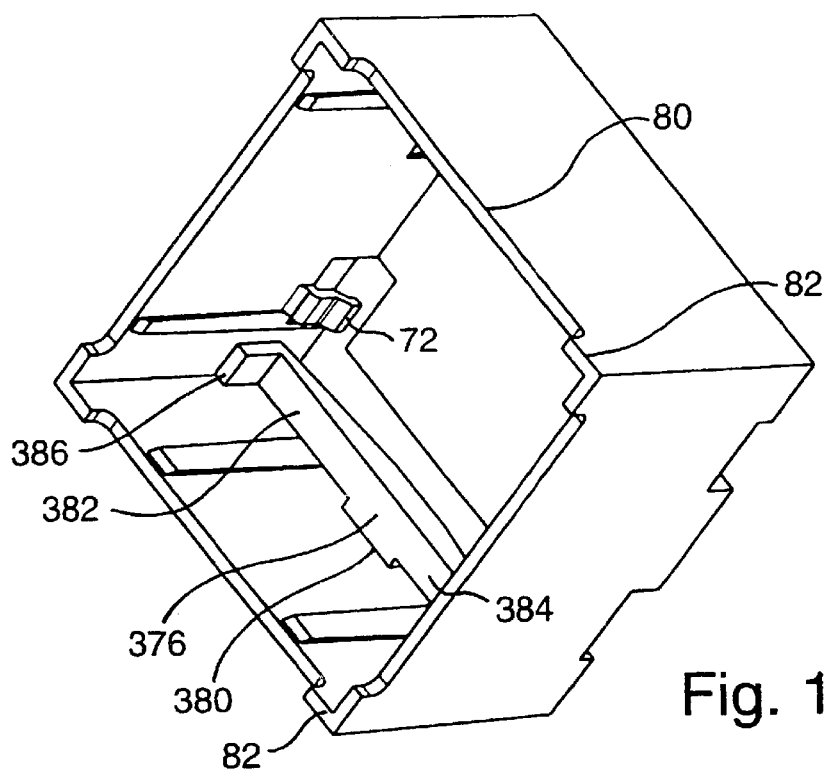
Figure 17B:
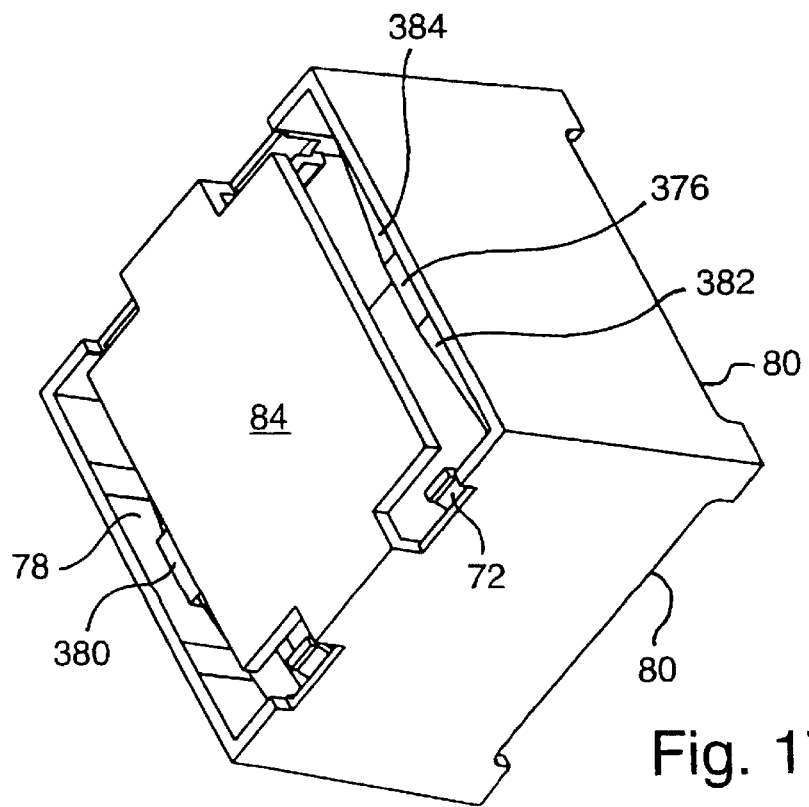

FIGS. 17a and 17b show a housing with, on each side, a single, double-ended arm 376 integrally moulded at its center 380 to a side wall of the housing. Spring arms 382 and 384 extend in opposite directions from the center 380 and the ends of these arms are provided with depending flanges 386 which, in use, will press against the laminations stack. The top of the housing is cut-away across the top of the springs as can be seen in FIG. 17b.

Figure 18A:
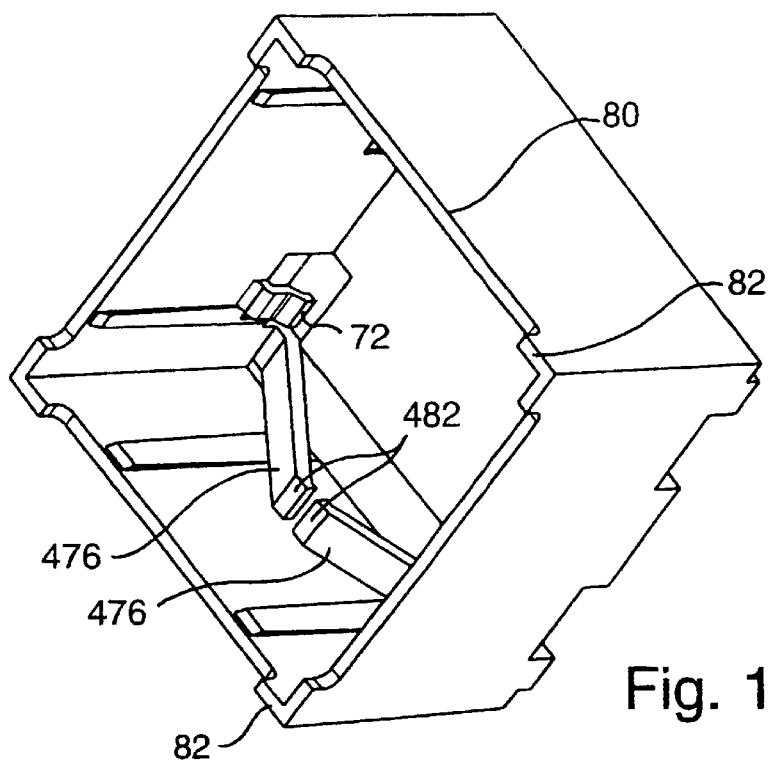
Figure 18B:
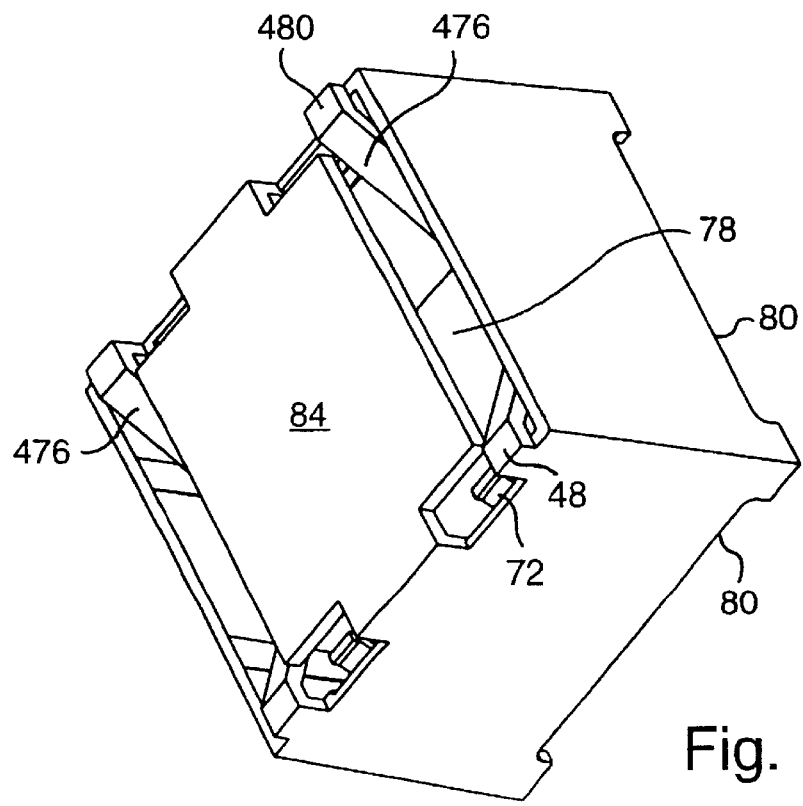

FIGS. 18a and 18b show a housing with, on each side, spring arms 476 similar to the arms 276 of FIG. 16. The difference between these two is that in FIG. 18, the arms do not cross and they exert pressure on the lamination stack through contact ends 482 at the center of the housing, rather than at points close to the lateral walls. The top of the housing is cut-away across the top of the springs as can be seen in FIG. 18b.

Figure 19A:
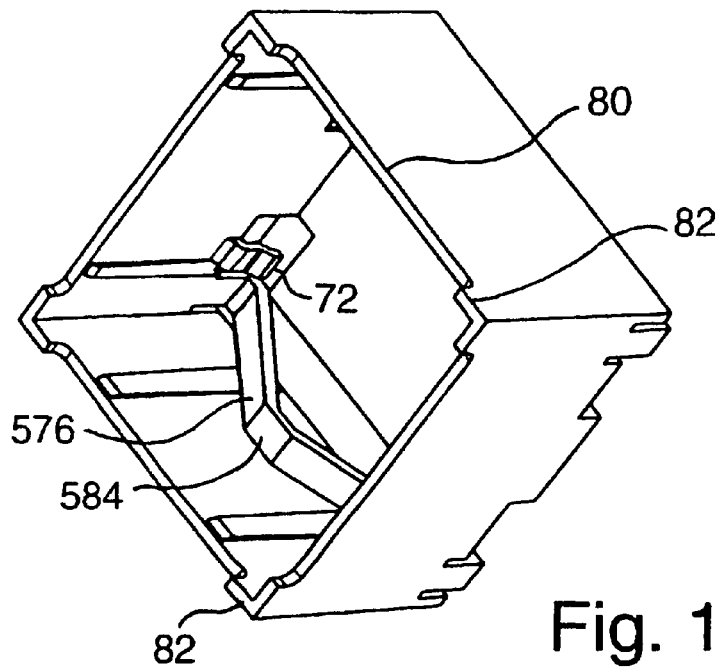
Figure 19B:
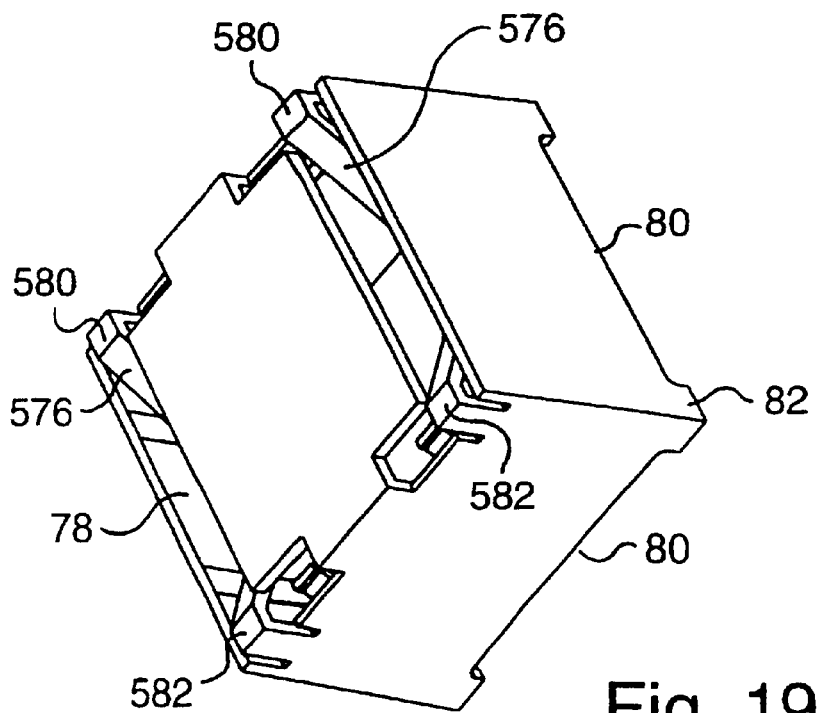

FIGS. 19a and 19b show a housing where there is a single spring arm 576 on each side, the arms each being formed by a continuous web which extends from one housing wall, at 580, to the opposite wall at 582. In the middle of the arm 576 is a contact area 584 which will exert a spring force on the lamination stack. This embodiment has the disadvantage that, as the spring arms 576 flex, they will exert an outward force on the housing walls causing some bowing of these walls. The top of the housing is cut-away across the top of the springs as can be seen in FIG. 19b.

The housing walls are of electrically insulating material, preferably at least 0.4 mm thick, so that the housing provides solid insulation and sufficiently long creepage and clearance paths through the open portions to insulate the transformer from other adjacent components and from any close surfaces of a housing in which the circuit incorporating the transformer is housed.

As mentioned earlier, the efficiencies resulting from the transformer design described here allow a smaller number of laminations 32 to be used to achieve the desired transformer performance. It will be seen from FIG. 2 that the central core of the bobbin is designed to receive a specific number of laminations, making up a stack of a certain height. If a lesser number of laminations is used, there needs to be some way in which they can be lightly pressed together to achieve optimum performance.

This can be achieved by the moulded springs 76 in the housing 70. When the completed transformer is fitted into the housing, the external limbs 77 of the laminations 32 will lie against the springs 76. When the transformer is pushed home into the housing, so that the feet 74 snap into the lugs 72, the springs 76 will be depressed, as shown in the left-hand part of FIG. 13. This will provide a force on the laminations pressing them lightly against one another, and the form, length and position of the springs will be designed to provide this force, whether the transformer has a full stack of laminations, or has less than a full stack.

The springs will also ensure that pressure is kept on the lug/foot joints 72,74 thus producing a rattle-free assembly.

The combination of the transformer and the housing 70 thus provides many advantages, beyond those already mentioned. For example, the presence of the housing adds robustness to the components both before and after they are mounted on a PCB. Once on the PCB, contact between the feet 82 and the board reduces stress on the transformer pins when a force is applied; the flat surfaces allow vacuum handling of the components and in general allows them to be manipulated with the same equipment used for encapsulated components.

A housing as described above can also be used for housing electronic components other than the transformers described above. The housing construction described here can have more general application. Many if not all of the advantages discussed above will then apply.

What is claimed is:

1. A bobbin for supporting concentric transformer windings, the bobbin having an area for receiving a primary winding, shoulders at each end of the primary winding area to define the space for the primary winding, an area for receiving a secondary winding surrounding the primary winding, and flanges at each end of the secondary winding area, wherein one of the shoulders bounding the primary winding area has a slot for the primary winding entry and exit wires, the slot extending across the shoulder from the primary winding area to the adjacent end of the bobbin, the slot communicating with an undercut region of the shoulder, below an upper surface of the shoulder, one lateral edge of the slot and the corresponding lateral edge of the undercut region diverging from one another in the direction of said adjacent bobbin end.

2. A bobbin as claimed in claim 1, wherein the bobbin core in the primary winding area has a generally rectangular cross-section and the end of the slot adjacent to the primary winding area lies on a corner of the bobbin rectangular cross section.

3. A bobbin as claimed in claim 2, wherein the opposite end of the slot lies midway between the position which will be taken up by entry and exit terminals for the primary winding.

4. A bobbin as claimed in claim 1, wherein the lateral edge of the undercut region lies substantially parallel to the bobbin axis, and the lateral edge of the slot lies at substantially 45° to the bobbin axis.

5. A bobbin as claimed in claim 1, wherein the end of the slot adjacent to the primary winding area is formed with a surface to engage and retain the wire as the wire passes over it, to hold the wire against axial tension.

6. A bobbin as claimed in claim 1, wherein the undercut extends laterally on both sides of the slot and both lateral edges of the undercut region lie substantially parallel to the bobbin axis.

7. A bobbin as claimed in claim 1, wherein the edge of the slot on the exit wire side of the slot is chamfered.

8. A bobbin as claimed in claim 1, wherein mountings for both primary and secondary winding terminals are located radially outside the winding spaces, with primary winding terminals being at one end of the bobbin and secondary winding terminals at the other end.

9. A bobbin as claimed in claim 1, wherein the primary winding area is located axially centrally relative to the secondary winding area.

10. A concentrically wound transformer formed on a bobbin as claimed in claim 1.

11. A bobbin for supporting concentric transformer windings, the bobbin having an area for receiving a primary winding, shoulders at each end of the primary winding area to define the space for the primary winding, an area for receiving a secondary winding surrounding the primary winding, and flanges at each end of the secondary winding area, wherein one of the shoulders bounding the primary winding area has a slot for the primary winding entry and exit wires, the slot extending across the shoulder from the primary winding area to the adjacent end of the bobbin, the slot communicating with an undercut region of the shoulder, below an upper surface of the shoulder, wherein a lateral edge of the undercut region lies at a first angle to, or substantially parallel to, the bobbin axis, and the lateral edge of the slot closest to the said lateral edge of the undercut diverges from the said lateral edge of the undercut in the direction of said adjacent bobbin end.

* * * * *